US 6,713,862 B2

(12) United States Patent
Palanisamy et al.

(10) Patent No.: US 6,713,862 B2
(45) Date of Patent: Mar. 30, 2004

(54) LOW TEMPERATURE CO-FIRED CERAMIC-METAL PACKAGING TECHNOLOGY

(75) Inventors: Ponnuswamy Palanisamy, Lansdale, PA (US); Attiganal Narayanaswamysreeram, Edison, NJ (US); Ellen Schwartz Tormey, Princeton Junction, NJ (US); Barry Jay Thaler, Lawrenceville, NJ (US); John Connolly, Clarksburg, NJ (US); Ramon Ubaldo Martinelli, Hightstown, NJ (US); Ashok Narayan Prabhu, East Windsor, NJ (US); Mark Stuart Hammond, Pennington, NJ (US); Joseph Mazzochette, Cherry Hill, NJ (US)

(73) Assignee: Lamina Ceramics, Westampton, NJ (US)

( * ) Notice: Subject to any disclaimer, the term of this patent is extended or adjusted under 35 U.S.C. 154(b) by 0 days.

(21) Appl. No.: 10/199,418

(22) Filed: Jul. 19, 2002

(65) Prior Publication Data

US 2003/0034564 A1 Feb. 20, 2003

Related U.S. Application Data

(63) Continuation-in-part of application No. 09/664,599, filed on Sep. 18, 2000, now Pat. No. 6,455,930.

(60) Provisional application No. 60/170,417, filed on Dec. 13, 1999, provisional application No. 60/206,519, filed on May 22, 2000, provisional application No. 60/206,170, filed on May 22, 2000, and provisional application No. 60/213,098, filed on Jun. 21, 2000.

(51) Int. Cl.$^7$ ............................................. H01L 23/34
(52) U.S. Cl. ..................... 257/703; 257/706; 257/712; 257/717; 257/720; 257/724; 174/252; 361/703
(58) Field of Search ................................. 257/706, 707, 257/712, 717, 720, 723, 724; 438/121, 122, 668, 700, 701, 703, 713, 738, 758, 778; 174/52.4, 252; 361/702

(56) References Cited

U.S. PATENT DOCUMENTS 6,023,413 A * 2/2000 Umezawa .................... 361/697

* cited by examiner

Primary Examiner—John B. Vigushin
Assistant Examiner—Lourdes Cruz
(74) Attorney, Agent, or Firm—Lowenstein Sandler PC

(57) ABSTRACT

Integrated packages incorporating multilayer ceramic circuit boards mounted on a metal support substrate can be used for temperature control by the metal support substrate. Various electronic components, as well as additional temperature control devices, can be connected to the circuit boards and to the metal support substrate to control or regulate the temperature of operation of the components. The integrated package can be hermetically sealed with a lid.

10 Claims, 4 Drawing Sheets

LOW TEMPERATURE CO-FIRED CERAMIC-METAL PACKAGING TECHNOLOGY

CROSS REFERENCE TO RELATED APPLICATIONS

This application is a continuation-in-part of U.S. application Ser. No. 09/664,599 filed by the present inventors on Sep. 18, 2000 now U.S. Pat. No. 6,455,930 and entitled "LOW TEMPERATURE CO-FIRED CERAMIC-METAL PACKAGING TECHNOLOGY" which claims the benefit of U.S. Provisional Applications Ser. No. 60/170,417 filed Dec. 13, 1999, Ser. No. 60/206,519 filed May 22, 2000, Ser. No. 60/206,170 filed May 22, 2000, and Ser. No. 60/213,098 filed Jun. 21, 2000. The 664,599 application and each of the provisional applications are incorporated herein by reference.

FIELD OF THE INVENTION

This invention relates to improved integrated packages that permit temperature control of devices mounted in or on the packages using multilayer ceramic circuit board technology. More particularly, this invention relates to hermetically sealed integrated packages using low temperature co-fired ceramic on metal (LTCC-M) support boards that have high thermal conductivity useful for temperature control of devices mounted on the metal support.

BACKGROUND OF THE INVENTION

Multilayer ceramic circuit boards are made from layers of green ceramic tapes. A green tape is made from particular glass compositions and optional ceramic powders, which are mixed with organic binders and a solvent, cast and cut to form the tape. Wiring patterns can be screen printed onto the tape layers to carry out various functions. Vias are then punched in the tape and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably from about 750–950° C. The composition of the glasses determines the coefficient of thermal expansion, the dielectric constant and the compatibility of the multilayer ceramic circuit boards to various electronic components.

More recently, metal support substrates (metal boards) have been used to support the green tapes. The metal boards lend strength to the glass layers. Moreover since the green tape layers can be mounted on both sides of a metal board and can be adhered to a metal board with suitable bonding glasses, the metal boards permit increased complexity and density of circuits and devices. In addition, passive and active components, such as resistors, inductors, capacitors and the like, can be incorporated into the circuit boards for additional functionality. Thus this system, known as low temperature cofired ceramic-metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of the LTCC-M structure must be matched to the thermal coefficient of expansion of the metal support board. Glass ceramic compositions are known that match the thermal expansion properties of various metal or metal matrix composites. These compositions are disclosed for example in U.S. Pat. No. 5,625,808 to Tormey et al; U.S. Pat. No. 6,017,642 to Kumar et al; U.S. Pat. No. 5,256,469 to Cherukuri et al; and U.S. Pat. No. 5,565,262 to Azzaro et al. U.S. Pat. No. 5,581,876 to Prabhu et al. disclose bonding glasses for adhering ceramic layers to metal support substrates. These references are incorporated herein by reference.

It would be highly desirable to be able to provide an integrated package for all required components on a single metal substrate, to provide adequate and low cost temperature control, and to provide a means for hermetically sealing the integrated package.

SUMMARY OF THE INVENTION

We have found that the LTCC-M system has an additional advantage for integrated package components that run hot. The conductive metal support substrate provides excellent heat sinking. Thus components that are hot can be either directly mounted onto the metal support board or be mounted to conductive vias in a multilayer ceramic circuit board that lead to the metal support board. For more complex integration, the LTCC-M technology can be used to provide additional heat sinking by connecting conventional heat sinks, or thermoelectric coolers, to, or through, the support substrate.

The metal support board can act as a heat sink, directly or indirectly, for devices such as semiconductor lasers, or for devices that use very dense circuitry. The temperature of semiconductor lasers during operation for example must be closely controlled because the wavelength of the emitted light depends on the temperature of the device and its environment. Another type of device wherein good temperature control is required is for thermal management of flip chip packaging. Densely packed microcircuitry, and devices such as amplifiers, oscillators and the like which generate large amounts of heat, can also use LTCC-M techniques advantageously. Similarly, the technique is useful with for packaging power resistors. A chip for flip chip packaging can be mounted bump side up within a cavity in the ceramic layer and bump bonded to a flex circuit that connects the input/output bumps to metal traces on the top layer of ceramic. Placing the chip on a metal support board provides the cooling required for high integration chips.

LTCC-M technology non flex package covers can be soldered to the package for applications requiring hermetic seals. Such covers can also include useful features such as solder re-flow indicators and imbedded trace wiring.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

DETAILED DESCRIPTION

Figure 1:
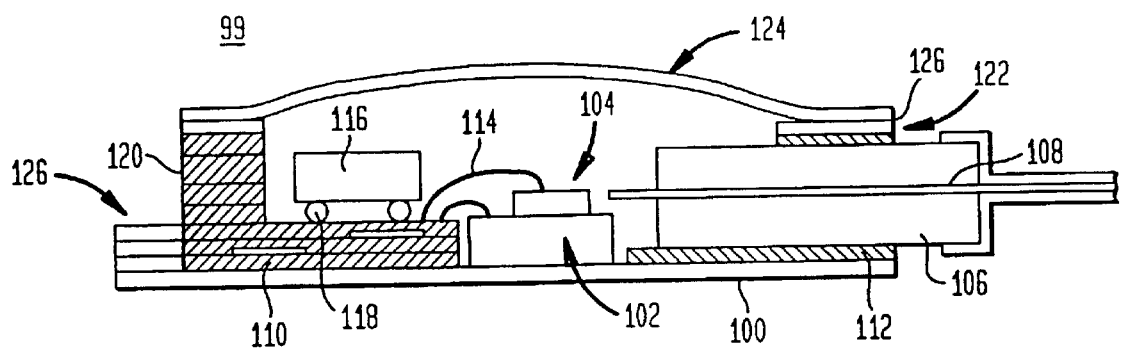
FIG. 1 is a schematic view of an integrated LTCC-M package including a laser device, an optical fiber, a heat spreader and embedded circuitry for driving the laser device.

This description is divided into two parts. In Part I we describe general features of packages in accordance with the invention, and in Part II we illustrate exemplary embodiments.

I. General Features

A bare semiconductor laser die can be mounted directly onto a metal base of the LTCC-M system having high thermal conductivity to cool the laser. In such case, the electrical signals to operate the laser must be connected to the laser from the ceramic. Indirect attachment to the metal support board can also be used.

The metal support boards used for LTCC-M technology do have a high thermal conductivity, but some metal boards have a high thermal coefficient of expansion, and thus a bare die cannot always be directly mounted to such metal support boards. However, some metal support boards are known that can be used for such purposes, such as metal composites of copper and molybdenum (including from 10–25% by weight of copper) or copper and tungsten (including 10–25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

However, in order to provide closer control of the temperature of a laser during operation to control the wavelength of the light emitted by the laser, conventional thermoelectric coolers can be used together with a metal support substrate. The laser is connected to an optical fiber which requires alignment components, such as optical isolators, and the laser must be mounted, directly or indirectly, on the metal support board. An optical detector is also required, as well as electrical leads connecting all of these components for an integrated package.

Another instance wherein good cooling is required is for thermal management of flip chip packaging. Densely packed microcircuitry, and devices such as amplifiers, oscillators and the like which generate large amounts of heat, can also use LTCC-M techniques advantageously. Metallization on the top layers of an integrated circuit bring input/output lines to the edge of the chip so as to be able to wire bond to the package or module that contains the chip. Thus the length of the wirebond wire becomes an issue; too long a wire leads to parasitics. The cost of very high integration chips may be determined by the arrangement of the bond pads, rather than by the area of silicon needed to create the circuitry. Flip chip packaging overcomes at least some of these problems by using solder bumps rather than wirebond pads to make connections. These solder bumps are smaller than wire bond pads and, when the chip is turned upside down, or flipped, solder reflow can be used to attach the chip to the package. Since the solder bumps are small, the chip can contain input/output connections within its interior if multilayer packaging is used. Thus the chip size will be determined by the number of transistors in it, rather than by the number and size of bond pads.

However, increased density and integration of functions on a single chip leads to higher temperatures on the chip, which may prevent full utilization of optimal circuit density. The only heat sinks are the small solder bumps that connect the chip to the package. If this is insufficient, small active or passive heat sinks must be added on top of the flip chip. Such additional heat sinks increase assembly costs, increase the number of parts required, and increase the package costs. Particularly if the heat sinks have a small thermal mass, they have limited effectiveness as well.

In the simplest form of the present invention, LTCC-M technology is used to provide an integrated package for a semiconductor laser and accompanying circuitry, together with an optical fiber held in a support, wherein the conductive metal support board provides a heat sink for the laser. In this package, all of the required components are mounted on a metal support board, incorporating embedded passive components such as conductors and resistors into the multilayer ceramic portion, to connect the various components, i.e., laser, optical fiber, circuits, heat sink and the like, in an integrated package. By matching the thermal coefficient of expansion (TCE) of the ceramic to the optical laser, thermal management is easy and flexible. The package can be hermetically sealed with a lid.

For a more complex structure having improved heat sinking, the integrated package of the invention combines a first and a second LTCC-M substrate. The first substrate has mounted thereon a laser device, an optical fiber, and a multilayer ceramic circuit board with embedded circuitry for operating the laser; the second substrate has a heat sink or conductive heat spreader mounted thereon. Thermoelectric cooler (TEC) and temperature control circuitry are mounted between the first and second substrates to provide improved temperature control of laser devices. A hermetic enclosure can be adhered to the metal support board. This integrated package thus provides integrated packaging for operation of a laser and an optical fiber, with extra cooling for improved temperature control.

The use of LTCC-M technology can also utilize the advantages of flip chip packaging together with integrated heat sinking. The packages of the invention can be made smaller, cheaper and more efficient than existing present-day packaging. The metal substrate serves as a heat spreader or heat sink. The flip chip can be mounted directly on the metal substrate, which is an integral part of the package, eliminating the need for additional heat sinking. A flexible circuit can be mounted over the bumps on the flip chip. The use of multilayer ceramic layers can also accomplish a fan-out and routing of traces to the periphery of the package, further improving heat sinking. High power integrated circuits and devices that have high thermal management needs can be used with this new LTCC-M technology.

II. Illustrative Embodiments

Referring to the drawings, FIG. 1 illustrates a first exemplary embodiment of an integrated package 99 in accordance with the present invention. A thermally conductive metal base 100, as of copper clad molybdenum or Kovar®, has a heat spreader 102 of a thermally conductive material bonded thereto. Conventional die attach methods can be used, such as Au—Sn eutectic. A semiconductor laser 104 is mounted on the heat spreader 102. Depending on the power dissipation and thermal stability requirements of the laser 104, the heat spreader 102 can comprise a material chosen from diamond film, copper-tungsten alloy, aluminum nitride and alumina, for example. Depending on the metal base chosen, some of these heat spreaders may be mounted directly on the metal base.

A housing 106 for an optical fiber 108 is mounted on a multilayer ceramic circuit board 112. The circuit board 112 is built up as required so as to maintain alignment between the optical fiber 108 and the semiconductor laser 104. A second ceramic circuit board 110 is mounted on the opposite side of the metal board 100 as the semiconductor laser 104. The laser 104 is connected by means of wire bonds 114 to the ceramic circuitry 110. This second ceramic circuit board 110 includes various drive components and embedded devices according to the functions desired. An IC chip 116 is mounted on the second ceramic circuit board 110 for driving the laser 104. The IC chip 116 is electrically connected to the second multilayer ceramic circuitry 110 by means of solder bumps 118. A third multilayer ceramic board 120 is joined to the second ceramic circuit board 110. A fourth ceramic board 122 is mounted on the edge of the optical fiber housing 106 to support a hermetically sealed lid 124. This lid 124 can be hermetically-sealed by means of seal rings 126 and soldering the lid 124 to the seal rings 126. Additional electrical input/output connections can be made to the second ceramic circuit board 110 as desired.

All of the circuit boards 110, 112 and 120 are fabricated at the same time on a single support board 100. The integrated device of FIG. 1 further includes a hermetically sealed semiconductor laser, laser driver circuitry, an optical fiber and a heat sink. Additional features can be added as described above. The metal base 100, made of a thermally conductive material, serves to regulate and control the temperature of the package in order to maintain tight tolerances for the light frequency emitted by the laser.

Figure 2:
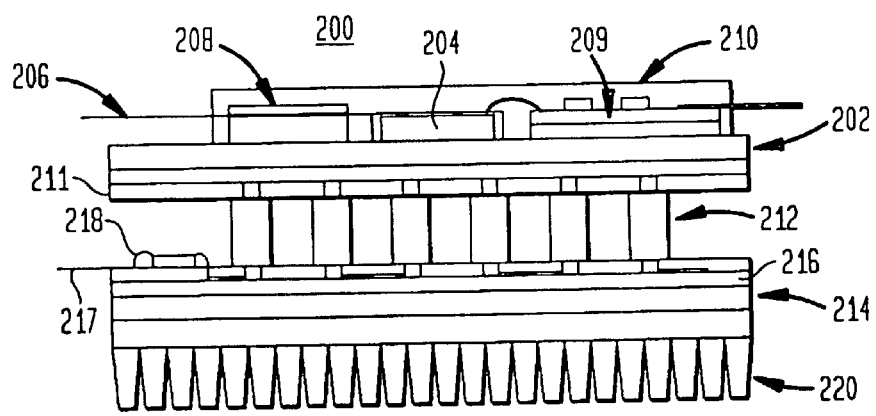
FIG. 2 is a schematic diagram of an integrated LTCC-M TEC/laser package that can be hermetically sealed.

FIG. 2 illustrates a more complex integrated package 200 supported by a metal support substrate 202. A laser chip 204 is mounted directly on the metal support substrate 202. The copper clad molybdenum support 202 has high thermal conductivity and a good thermal coefficient of expansion (TCE) matched to the indium phosphide or gallium arsenide laser device 204, which thus can be mounted directly thereon. The TCE suitably is about 5.5 ppm/° C. from room temperature to 300° C. which minimizes stresses across the device. An optical fiber 206 is supported on a silicon plate 208 having a V-groove for the fiber therein (not shown). This silicon plate 208 is also mounted on the metal support substrate 202. A multilayer ceramic circuit board 209 is also mounted on the metal support substrate 202. A lid 210, also mounted on the metal support substrate 202, is hermetically sealed thereto. The laser 204 is wire bonded to the multilayer ceramic circuit 209.

On the opposite side of the metal support substrate 202 is a multilayer ceramic circuit board 211 for connecting to a set of thermoelectric plates 212, suitably made from $Bi_2Te_3$, that regulate and control the temperature of the metal support substrate 202 and the laser 204. These plates 212 can be soldered to the metal support board. The plates 212 are connected in series with appropriate circuitry in the ceramic circuit boards 211 and 216.

A second metal support substrate 214, also of copper clad molybdenum or Kovar®, has a multilayer ceramic circuit board 216 thereon, also with circuitry to connect the plates 212 in series. This ceramic circuit board 216 also includes power leads 217 and temperature control circuitry 218 thereon, e.g., an embedded resistor, to control the temperature of the thermoelectric plates 212 and to deliver power to the TEC cooler.

On the opposite side of the second metal support substrate 214, is an aluminum or copper heat sink 220 to provide additional heat dissipation.

Other metallizations for mounting additional components onto the fired multilayer ceramic 216 or to the metal base 202 can also be applied. In addition, a groove to support an optical fiber can readily be made in a green tape stack prior to firing instead of forming a groove in the silicon plate 208.

The fiber input port can be hermetically sealed by laser soldering for example, when the input port is designed to accept fibers with metal sleeves; alternatively, thin metal coated fibers can be sealed directly. A coating of a polymer such as parylene can also aid in obtaining hermeticity of the package.

The thermal stability of the ceramic improves system stability and reliability for the integrated package.

Figure 3:
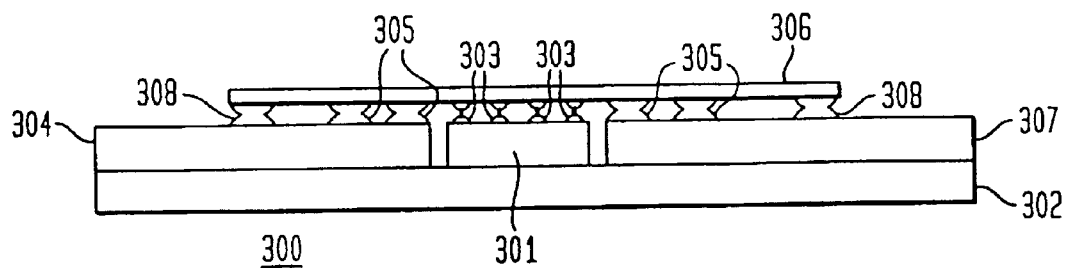
FIG. 3 is a cross sectional view of a flip chip package mounted on an LTCC-M substrate.
Figure 4:
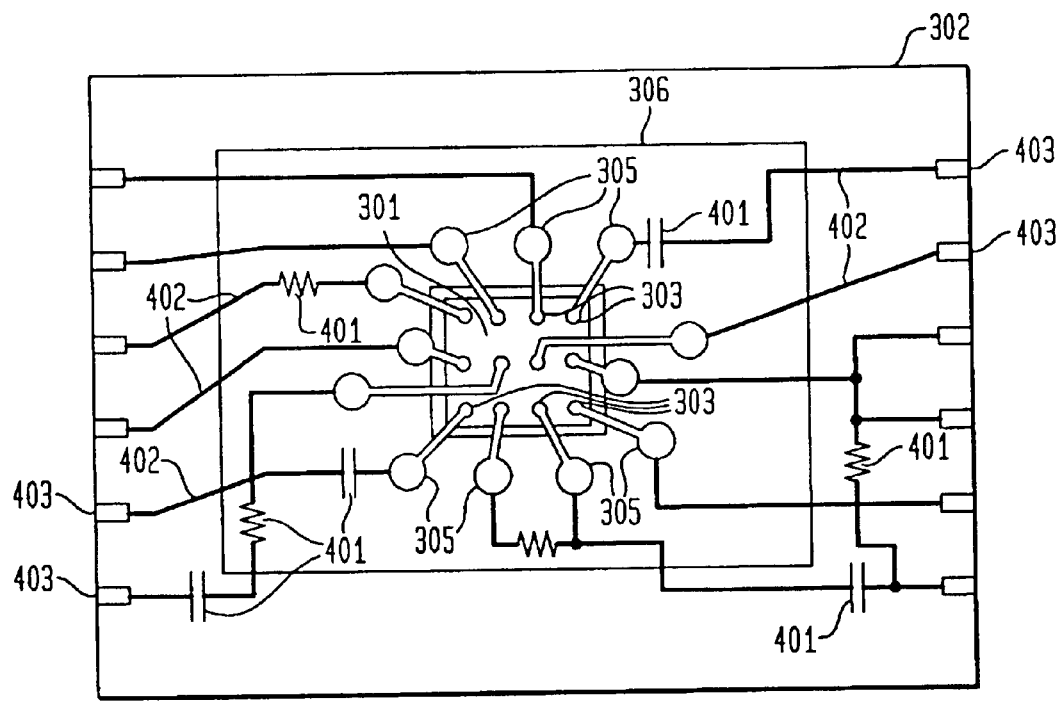
FIG. 4 is a top view of an LTCC-M package with a flip chip bonded integrated circuit connected to the top ceramic layer through an overlying flexible circuit.

A third embodiment 300 of the invention is shown in FIGS. 3 and 4 which are conceptual side and top views, respectively. The solder bumps and traces are drawn in concept only and do not match exactly.

An integrated circuit 301, which can be a flip chip or ball grid array integrated circuit, is mounted on a metal support substrate 302. An array of solder bumps 303, which replace conventional wire bonding pads for Input/Output (I/O) are added to the integrated circuit 301 upside down, e.g., bump side up. The integrated circuit 301 can be connected to LTCC-M metal support 302 directly using solder reflow or be connected to conductive vias (not shown) that lead to the metal support. Ceramic circuits 304 and 307 are adhered to the metal support 302 on either side of the integrated circuit 301, and solder-bumps 305 are adhered to the top of the ceramic surface. The surfaces of the ceramic circuit boards 304 and 307 and the integrated circuit 301 are metallized. A flexible circuit 306 having the same grid array as the integrated circuit 301 and the ceramic circuits 304, is adhered to the metallization layer. The flexible circuit 306 connects the grid array bonding bumps 305 to fan-out traces on the flexible circuits 306 which in turn connect to the solder bumps 305 on the top ceramic layers. These features permit the packaged integrated circuit to be directly connected to a large heat sink (the metal support board) that is an integral part of the package, increasing heat spreading and heat removal capacity for the circuit. The flexible circuit can be hermetically sealed by solder trace 308 (not shown in FIG. 4).

FIG. 4 is a conceptual top view of this package. The flexible circuit 306 is shown transparent so that FIG. 4 can illustrate the underlying metal traces 402, components 401, the ceramic layers 304 and 307, the bonding bumps 305 and the ball grid array bumps 303. The center integrated circuit 301 underlies the flexible circuit 306. The metal lines 402 connecting passive components 401, extend to the edge of the package attach pins 403 at the edges of substrate 302. Solder connections can be made at the edges to attach pins 403 or to other connectors. The flexibility of the overlayer circuit 306 aids in alignment with the underlying integrated circuit 301 and the ceramic layers 304 and 307.

Figure 5:
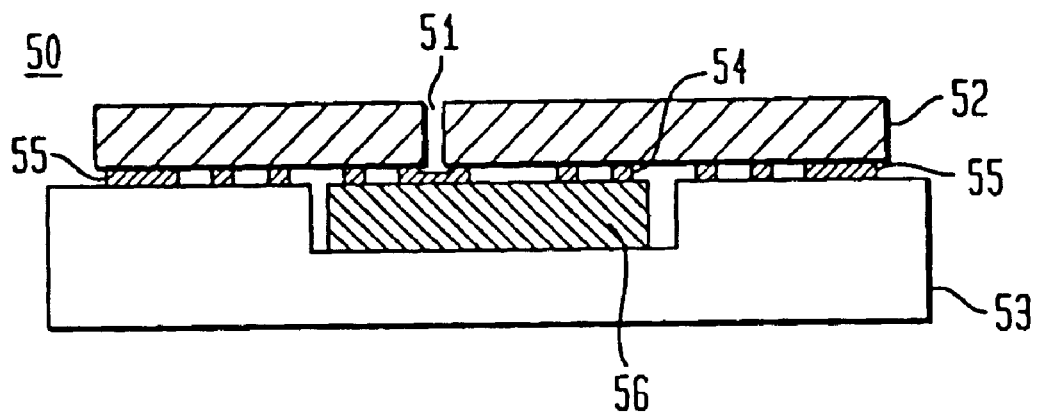
FIG. 5 is a cross sectional view of an LTCC-M package with a flip chip bonded integrated circuit connected to the top ceramic layer through an overlying non-flexible cover.

Alternatively, the flexible circuit (306 of FIG. 3) can be replaced with a non-flexible (rigid) circuit which provides a protective cover and can connect to a flip chip IC within the covered cavity. FIG. 5 is a schematic side view showing such a package where non-flexible circuit 52 covers cavity mounted IC56. Circuit 52, via solder balls 54 and a fan out design, connects IC56 to a ceramic surface of an LTCC-M metal substrate 53. The non-flexible circuit 52 can be sealed to the substrate 53 by a solder seal ring 55 along the perimeter of the circuit and on the substrate. Seal ring 55 can be conveniently formed of corresponding seal rings on the circuit 52 and the substrate 53 which are joined together during the solder reflow operation to enclose IC56 within a hermetically sealed chamber.

Figure 5A:
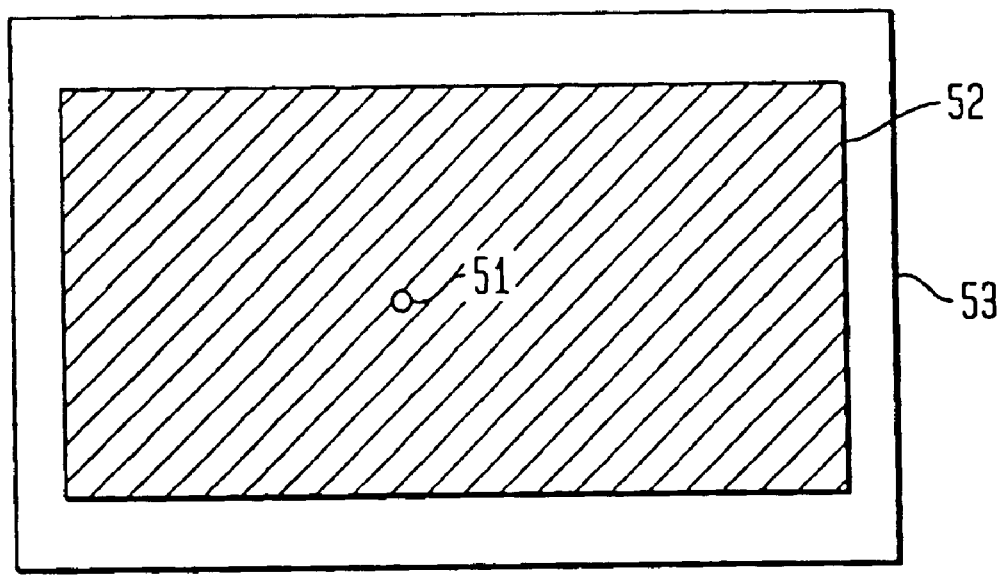
FIG. 5A is a top view of the LTCC-M package non-flexible cover shown in FIG. 5.

In addition to enhanced mechanical protection and hermetic sealing, another advantage of using a non-flexible circuit 52 relates to ease of inspection. Holes 51 slightly smaller than the solder bumps on IC56 can be formed in circuit 56 in registration with the ball grid array on IC56. Solder can then be applied annularly around the holes 51 on the bonding surface of circuit 52. When the circuit 52 is placed on the ball grid array 54 of IC56, the annular solder rings will contact the balls of the grid array. After solder reflow, the soldered bumps are visible on inspection through holes 51 in a top view (FIG. 5A). Since the quality of the solder joints can be optically inspected, conventional x-ray inspection is no longer needed.

Figure 6:
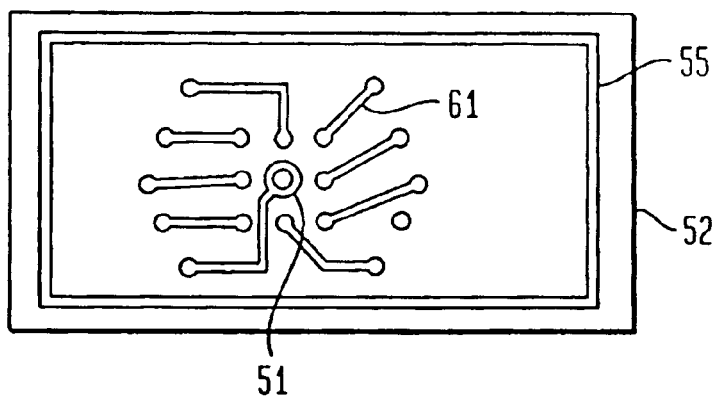
FIG. 6 is a top view of the conductive traces on the non-flexible cover of an LTCC-M package.

An additional advantage of the non-flexible circuit 52 is that it can be a multilayer circuit incorporating a plurality of trace layers to simplify the fan-out routing of trace layers to connect IC56. FIG. 6 illustrates the soldering surface 60 of a circuit 52 showing the traces 61 of an exemplary fan-out pattern.

Figure 7:
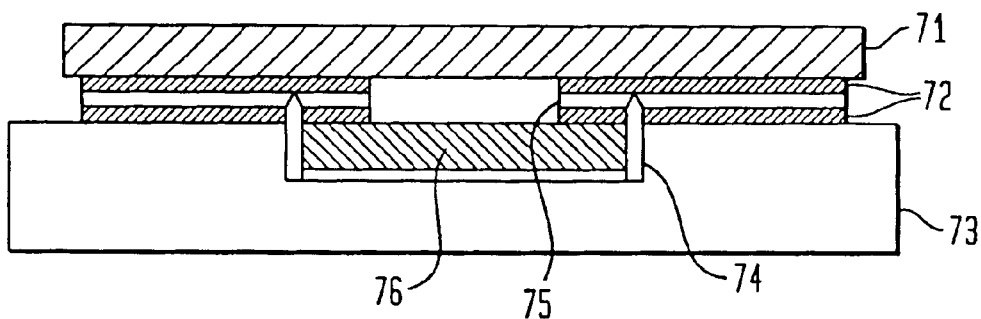
FIG. 7 is a cross sectional view of a high power resistor with two connections made in the cover of an mounted on an LTCC-M package.
Figure 7A:
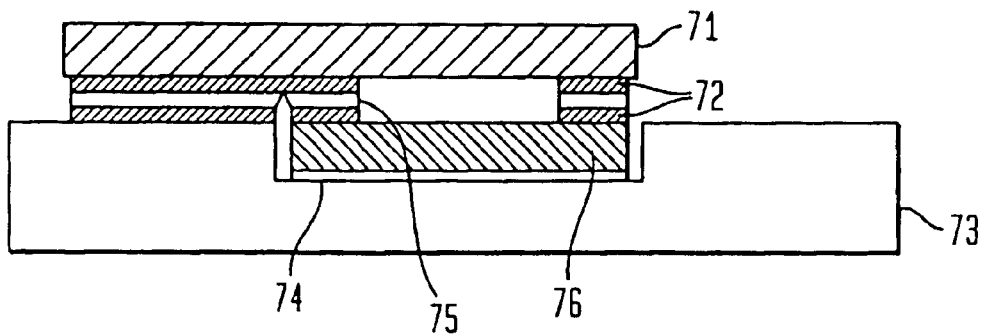
FIG. 7A is a cross sectional view of a high power resistor with one connection made in the cover of an mounted on an LTCC-M package.

An advantageous application of the non-flexible circuit cover package is for packaging a surface mount power resistor in the cavity of an LTCC-M substrate. A power resistor is a resistor which has a power dissipation typically greater than about 10 times the power dissipation rating of the majority of resistors in the package. Such application is schematically illustrated in FIGS. 7 and 7A wherein a non-flexible circuit cover 71 connects a high power resistor 76 to the LTCC-M circuitry.

The resistor is mounted directly on the metal substrate 73 to maximize thermal conductivity to the substrate. FIG. 7 illustrates a high power resistor 76 with two connections to the LTCC-M circuitry. FIG. 7A illustrates a high power resistor with one connection 74 to the LTCC-M circuitry. Solder terminations 72 are connected by solder reflow 75.

The integrated laser package and the TEC cooler of FIG. 2 as an example can be made by
 a) fabricating a first LTCC-M substrate having the number of ceramic layers and embedded circuitry for operating the laser device and the TEC. A double sided metal support substrate can accommodate interconnect requirements for the laser device on the one side and the TEC on the other side;
 b) metallizing the LTCC-M substrate as required to permit soldering thereto of the various components;
 c) attaching surface mounted devices to the LTCC-M substrates, and
 d) assembling the TEC with the first and second LTCC-M substrates and the $Bi_2Te_3$ plates by soldering the plates to metallized pads on the multilayer ceramic layers,
 e) attaching the heat sink to the bottom side of the second LTCC-M substrate,
 f) assembling the laser device and the fiber optic components to the top side of the first LTCC-M substrate,
 g) aligning the optical fiber to the laser, and
 h) attaching a lid -to the top of the first LTCC-M substrate with a hermetic seal.

The other embodiments can be made in like manner using the LTCC-M technology.

The above integrated packages provides integration of optical, electrical and cooling functions in a single package, providing a compact package which is reliable and has excellent overall performance; the use of LTCC-M technology enables the incorporation of embedded circuitry for operating a laser, the TEC plates, including power supply circuitry, an embedded resistor for temperature control of the laser, adding to its overall reliability and performance. The use of a low TOE LTCC-M material minimizes stresses across the cooler which result from the temperature difference between the hot and cold faces of the substrate, further improving reliability of the package.

The overall design can be readily customized to add additional electronic devices and circuitry as will be apparent to one skilled in the art.

In summary, a low temperature cofired ceramic-metal (LTCC-M) system integrated package has a first circuit board comprising conductive traces and a second circuit board comprising conductive traces and electronic components. The first metal substrate supports the second circuit board. The second metal substrate is connected to the first metal substrate via a heat pump. The second circuit board is a ceramic circuit board. The first circuit board is bonded over the second circuit board to seal the electronic components on the second circuit board with traces of the first circuit board connecting electronic components on the second circuit board. In one embodiment, at least one of the components is a resistor. The resistor can be a power resistor.

A flip chip can also be mounted on the first metal substrate. The first circuit board can be bonded over the flip chip to hermetically seal the flip chip with traces of the first circuit board connecting the flip chip with components on the second circuit board. The seal can be a hermetic seal.

In another embodiment, a low temperature cofired ceramic-metal (LTCC-M) system integrated package as described above, but not necessarily including a resistor or power resistor, the first circuit board can be a non-flexible circuit. And, a flip chip can be mounted on the first metal substrate. The first circuit board can be bonded over the flip chip to hermetically seal the flip chip with traces of the first circuit board connecting the flip chip with components on the second circuit board.

The non-flexible circuit can be bonded to the ceramic circuit board and the flip chip by solder bumps. And, viewing holes can be provided in the non-flexible circuit for post soldering inspection of connections to the solder bumps. The flip chip can be electrically connected to the ceramic circuit board by the non-flexible circuit. And, the seal can be a hermetic seal.

Although the invention has been described in terms of certain components and number of metal support substrates, it will be apparent to one skilled in the art that the metal support board used in LTCC-M technology can be used as a heat sink or can attach to additional heat sinking devices wherever they are needed to control temperature and reduce hot spots in an integrated package.

The invention is not meant to be limited to the details described above, but only by the scope of the appended claims.

We claim:
1. A low temperature cofired ceramic-metal (LTCC-M) system integrated package comprising:
 a first circuit board comprising conductive traces;
 a second circuit board comprising conductive traces and electronic components;
 a first metal substrate supporting the second circuit board;
 a second metal substrate connected to the first metal substrate via a heat pump;
wherein the second circuit board is a ceramic circuit board;

the first circuit board is bonded over the second circuit board, to seal the electronic components on the second circuit board, with traces of the first circuit board connecting electronic components on the second circuit board; and at least one of the components is a resistor.

2. The device of claim 1 wherein at least one of the resistors is a power resistor.

3. The device of claim 1 further comprising a flip chip mounted on the first metal substrate, and the first circuit board is bonded over the flip chip to hermetically seal the flip chip with traces of the first circuit board connecting the flip chip with components on the second circuit board.

4. The integrated package of claim 1 wherein the seal is a hermetic seal.

5. A low temperature cofired ceramic-metal (LTCC-M) system integrated package comprising:

a first circuit board comprising conductive traces;

a second circuit board comprising conductive traces and electronic components;

a first metal substrate supporting the second circuit board;

a second metal substrate connected to the first metal substrate via a heat pump;

wherein the second circuit board is a ceramic circuit board;

the first circuit board is bonded over the second circuit board, to seal the electronic components on the second circuit board, with traces of the first circuit board connecting electronic components on the second circuit board; and the first circuit board is a non-flexible circuit.

6. The device of claim 5 further comprising a flip chip mounted on the first metal substrate, and the first circuit board is bonded over the flip chip to hermetically seal the flip chip with traces of the first circuit board connecting the flip chip with components on the second circuit board.

7. The integrated package of claim 5 wherein the non-flexible circuit is bonded to the ceramic circuit board and the flip chip by solder bumps.

8. The integrated package of claim 5 wherein the non-flexible circuit comprises viewing holes for post soldering inspection of connections to the solder bumps.

9. The integrated package of claim 5 wherein the flip chip is electrically connected to the ceramic circuit board by the non-flexible circuit.

10. The integrated package of claim 5 wherein the seal is a hermetic seal.

* * * * *